United States Patent
Kajitani et al.

(10) Patent No.: US 9,666,664 B2
(45) Date of Patent: May 30, 2017

(54) SEMICONDUCTOR DEVICE

(71) Applicant: Panasonic Intellectual Property Management Co., Ltd., Osaka (JP)

(72) Inventors: Ryo Kajitani, Osaka (JP); Tetsuzo Ueda, Osaka (JP); Yoshiharu Anda, Osaka (JP); Naohiro Tsurumi, Kyoto (JP); Satoshi Nakazawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/663,140

(22) Filed: Mar. 19, 2015

(65) Prior Publication Data
US 2015/0194483 A1  Jul. 9, 2015

Related U.S. Application Data

(63) Continuation of application No. PCT/JP2013/005576, filed on Sep. 20, 2013.

(30) Foreign Application Priority Data

Sep. 28, 2012 (JP) .................................. 2012-217917

(51) Int. Cl.
*H01L 29/40* (2006.01)
*H01L 29/06* (2006.01)
(Continued)

(52) U.S. Cl.
CPC ...... *H01L 29/0611* (2013.01); *H01L 29/2003* (2013.01); *H01L 29/205* (2013.01);
(Continued)

(58) Field of Classification Search
CPC ............. H01L 29/402; H01L 29/66462; H01L 29/7786; H01L 29/2003; H01L 29/78;
(Continued)

(56) References Cited

U.S. PATENT DOCUMENTS 7,800,132 B2* 9/2010 Smorchkova ......... H01L 29/404
257/192
2005/0051796 A1* 3/2005 Parikh .................. H01L 29/812
257/192
(Continued)

FOREIGN PATENT DOCUMENTS

JP   2004-200248   7/2004
JP   2007-537593   12/2007
(Continued)

OTHER PUBLICATIONS

International Search Report of PCT application No. PCT/JP2013/005576 dated Dec. 10, 2013.
(Continued)

*Primary Examiner* — Jarrett Stark
*Assistant Examiner* — Bitew Dinke
(74) *Attorney, Agent, or Firm* — McDermott Will & Emery LLP

(57) ABSTRACT

An object is to achieve an increase in gain by reducing a current collapse, and reducing Cgd and Rg. A semiconductor device according to the present invention includes a substrate; a first semiconductor layer disposed on the substrate and made of a Group III nitride semiconductor; a second semiconductor layer disposed on the first semiconductor layer and made of a Group III nitride semiconductor; a gate electrode, a source electrode, and a drain electrode disposed on the second semiconductor layer; a first field plate electrode disposed on the second semiconductor layer; and a second field plate electrode disposed on the first field plate electrode, in which the first field plate electrode and the second field plate electrode are disposed between the gate electrode and the drain electrode.

17 Claims, 8 Drawing Sheets

(51) Int. Cl.
*H01L 29/66* (2006.01)
*H01L 29/778* (2006.01)
*H01L 29/20* (2006.01)
*H01L 29/205* (2006.01)
*H01L 29/51* (2006.01)
*H01L 29/78* (2006.01)

(52) U.S. Cl.
CPC .......... *H01L 29/402* (2013.01); *H01L 29/404* (2013.01); *H01L 29/51* (2013.01); *H01L 29/66462* (2013.01); *H01L 29/7786* (2013.01); *H01L 29/78* (2013.01)

(58) Field of Classification Search
CPC ..... H01L 29/205; H01L 29/404; H01L 29/51; H01L 29/0611; H01L 29/41758; H01L 29/66431; H01L 29/7787
See application file for complete search history.

(56) References Cited

U.S. PATENT DOCUMENTS

| | | |
|---|---|---|
| 2005/0253167 A1 | 11/2005 | Wu et al. |
| 2005/0253168 A1* | 11/2005 | Wu .................... H01L 29/7787 257/192 |
| 2006/0006415 A1* | 1/2006 | Wu .................... H01L 29/7787 257/194 |
| 2006/0102929 A1 | 5/2006 | Okamoto et al. |
| 2006/0175670 A1* | 8/2006 | Tsubaki ............ H01L 21/31111 257/409 |
| 2007/0059873 A1* | 3/2007 | Chini ................. H01L 27/0605 438/199 |
| 2007/0228422 A1* | 10/2007 | Suzuki ............... H01L 27/0605 257/213 |
| 2007/0235775 A1* | 10/2007 | Wu ...................... H01L 29/402 257/288 |
| 2008/0073670 A1* | 3/2008 | Yang ................... H01L 29/404 257/194 |
| 2008/0128752 A1 | 6/2008 | Wu |
| 2009/0230430 A1* | 9/2009 | Miyamoto ........... H01L 29/404 257/192 |
| 2009/0236635 A1 | 9/2009 | Wu et al. |
| 2009/0267116 A1 | 10/2009 | Wu et al. |
| 2011/0169054 A1 | 7/2011 | Wu et al. |
| 2011/0221011 A1* | 9/2011 | Bahat-Treidel ....... H01L 29/404 257/409 |
| 2012/0018735 A1* | 1/2012 | Ishii ..................... H01L 29/404 257/76 |
| 2012/0049243 A1* | 3/2012 | Wu ....................... H01L 29/402 257/194 |
| 2012/0217544 A1* | 8/2012 | Ohki ..................... H01L 29/402 257/194 |
| 2013/0069173 A1* | 3/2013 | Chang .................. H01L 29/402 257/409 |
| 2014/0092638 A1* | 4/2014 | Nishimori ......... H01L 29/41725 363/17 |

FOREIGN PATENT DOCUMENTS

| | | |
|---|---|---|
| JP | 2007-537594 | 12/2007 |
| JP | 2007-537596 | 12/2007 |
| JP | 2008-124440 | 5/2008 |
| JP | 2010-182829 | 8/2010 |
| JP | 2012-028423 | 2/2012 |
| WO | 2005/114744 | 12/2005 |

OTHER PUBLICATIONS

J. A. Mittereder et al., "Current collapse induced in AlGaN/GaN high-electron-mobility transistors by bias stress" Appl. Phys. Letts. vol. 83, No. 8 1650-1652 (2003).

T. Kikkawa et al., "Surface-Charge Controlled AlGaN/GaN-Power HFET without Current Collapse and Gm Dispersion" IEDM Tech. Dig., 585-588 (2001).

* cited by examiner

SEMICONDUCTOR DEVICE

TECHNICAL FIELD

The present invention relates to a semiconductor device and a method for manufacturing the same, and more particularly to a semiconductor device concerning a nitride semiconductor field effect transistor and a method for manufacturing the same.

BACKGROUND ART

A Group III nitride semiconductor such as $Al_xGa_yIn_{1-x-y}N$ ($0 \le x \le 1$, $0 \le y \le 1$) including gallium nitride (GaN) is wide in forbidden band width, high in electron saturation speed, and high in breakdown field, compared with silicon (Si) and gallium arsenide (GaAs). Therefore, its research and development has been enthusiastically carried out in order to realize a high-frequency, high-power, and high-breakdown-voltage Group III nitride semiconductor field effect transistor (FET) made of a material such as AlGaN or GaN.

When a high voltage is applied between a gate electrode and a drain electrode (between a gate and a drain) while the Group III nitride semiconductor FET is operated, a drain current is reduced, a current leak is increased, and breakdown will be observed. These are caused by a current collapse. The current collapse occurs because a high electric field is applied at a gate electrode end, electrons are accelerated and become hot electrons, and as a result, the electrons are trapped to a level existing in the forbidden band of the Group III nitride semiconductor (refer to non-patent literature 1, for example). Because the electrons are trapped to that level, a channel of the FET becomes narrow, so that the drain current is reduced.

The level existing in the forbidden band of the Group III nitride semiconductor is attributed to a surface of the semiconductor, or attributed to a bulk semiconductor. As a method for reducing the level attributed to the surface of the semiconductor, a protective film made of SiN is used. More specifically, it is reported that the surface level can be reduced when the SiN protective film is used, so that the current collapse can be prevented (refer to a non-patent literature 2, for example). However, even when the SiN protective film is used, a high electric field is applied at the gate electrode end when the FET is operated at a high voltage, so that the current collapse cannot be sufficiently prevented from being generated.

Thus, as a means proposed for relaxing the electric field applied at the gate electrode end, a gate field plate electrode that is electrically connected to the gate electrode is disposed between the gate electrode and the drain electrode (refer to patent literature 1, for example).

However, there is a possibility that the gate field plate electrode causes an increase in parasitic capacity Cgd between the gate and the drain, and a sufficient gain cannot be obtained. Thus, according to a proposed method, a field plate electrode that is connected to the source electrode is disposed between the gate electrode and the drain electrode, so that Cgd is reduced, the current collapse is prevented, and the gain is increased (refer to patent literature 2, for example).

CITATION LIST

Patent Literature

PTL1: Unexamined Japanese Patent Publication No. 2004-200248

PTL2: Japanese Translation of PCT Publication No. 2007-537593

Non-Patent Literature

Non-PTL1: J. A. Mitterender et al., Appl. Phys. Lett. 83, 1650 (2003)
Non-PTL2: T. Kikkawa et al., IEDM Tech. Dig., 585 (2001)

SUMMARY OF THE INVENTION

In general, as the means for increasing the gain in the FET, other than reducing Cgd, reducing source parasitic resistance Rs or gate parasitic resistance Rg is also an effective method.

Here, according to a structure disclosed in the patent literature 1, the field plate electrode is set to achieve both of the reduction in current collapse and the reduction in Cgd, and a thickness of the gate electrode is increased to achieve the reduction in Rg, but in this structure, a sidewall of the gate electrode is abruptly inclined. As a result, a coverage of the field plate electrode formed on the sidewall part of the gate electrode is reduced, and the field plate electrode is disconnected, so that the problem that the gain is reduced occurs.

Meanwhile, according to the patent literature 2, in the case where the source field plate is formed on a side of the gate electrode part, a certain gap is generated between the gate electrode and the field plate electrode, so that the high electric field generated at the gate electrode end cannot be effectively relaxed.

Thus, it is an object of the present invention to achieve both of an increase in gain by increasing a thickness of a gate electrode to reduce Rg, and an increase in gain by forming a source field plate to relax an electric field, and reduce Cgd.

In order to achieve the above object, a semiconductor device according to one aspect of the present invention includes a substrate, a first semiconductor layer disposed on the substrate and made of a Group III nitride semiconductor, and a second semiconductor layer disposed on the first semiconductor layer and made of a Group III nitride semiconductor. In addition, the semiconductor device includes a gate electrode, a source electrode, and a drain electrode disposed on the second semiconductor layer, a first field plate electrode disposed on the second semiconductor layer, and a second field plate electrode disposed on the first field plate electrode. The semiconductor device is characterized in that the first field plate electrode and the second field plate electrode are disposed between the gate electrode and the drain electrode.

According to the present invention, useful effects concerning an increase in gain can be obtained by reducing a current collapse, reducing Cgd, and reducing Rg.

DESCRIPTION OF EMBODIMENTS

Hereinafter, exemplary embodiments of the present invention will be described in detail with reference to the drawings. In addition, materials and numerical values are shown in each exemplary embodiment for purposes for illustration and not limitation. Furthermore, a layout structure illustrated in each exemplary embodiment is a favorable example, and the present invention is not limited to this. Still furthermore, components in the exemplary embodiments can be appropriately combined within a compatible level.

First Exemplary Embodiment

Hereinafter, a description will be given to a structure and a manufacturing method of a semiconductor device according to the first exemplary embodiment of the present invention.

(Description of Structure)

Figure 1A:
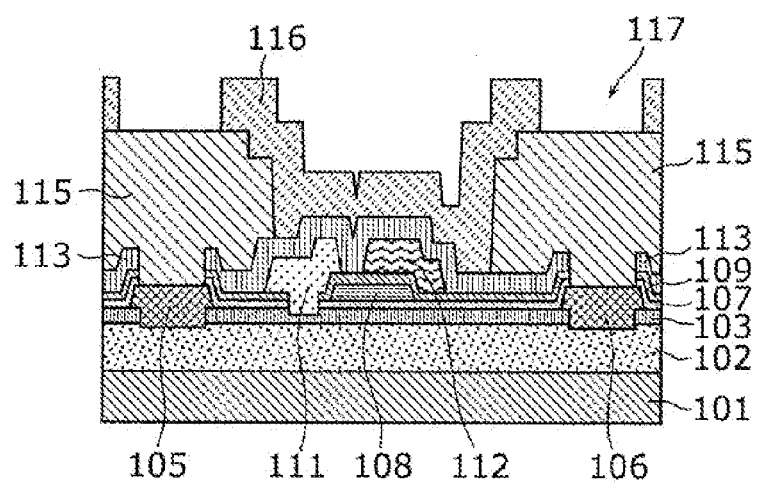
FIG. 1A is a cross-sectional view of a semiconductor device according to a first exemplary embodiment.
Figure 1B:
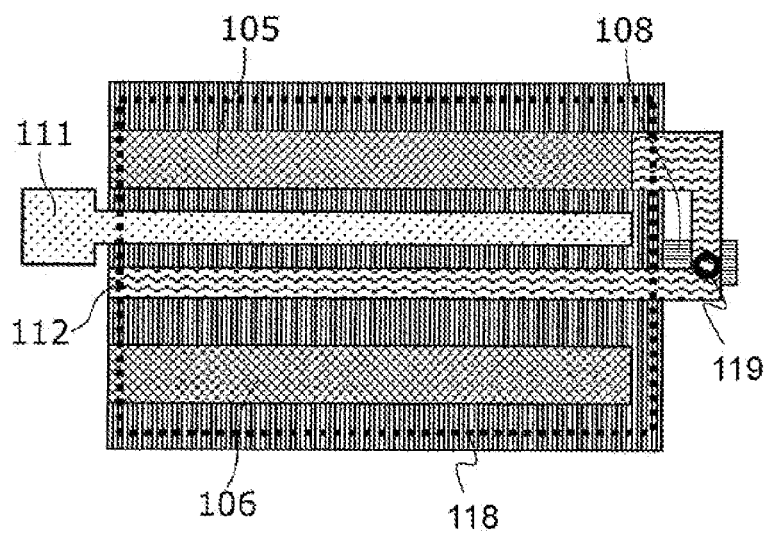
FIG. 1B is a plan view of the semiconductor device according to the first exemplary embodiment.

FIGS. 1A and 1B are a cross-sectional view and a top view of the semiconductor device according to the first exemplary embodiment, respectively.

As illustrated in FIG. 1A, first semiconductor layer 102 made of a Group III nitride semiconductor, and second semiconductor layer 103 made of a Group III nitride semiconductor are disposed on substrate 101 made of silicon (Si), gallium nitride (GaN), sapphire, or SiC, for example. In addition, first semiconductor layer 102 is favorably made of GaN, for example and second semiconductor layer 103 is favorably made of AlGaN such as $Al_xGa_{1-x}N$, for example (x=0.3, for example). Here, it is favorable that a bandgap in second semiconductor layer 102 is larger than a bandgap in a channel region of first semiconductor layer 102. In addition, a hetero barrier is formed in an interface between first semiconductor layer 102 and second semiconductor layer 103 (a hetero junction is formed in the interface), and a two-dimensional electron gas layer is formed there.

Furthermore, source electrode 105, drain electrode 106, and first protective film 107 are disposed on second semiconductor layer 103, and first field plate electrode 108 is disposed on first protective film 107. Furthermore, second protective film 109 is disposed on first field plate electrode 108.

In addition, gate electrode 111 is disposed on second semiconductor layer 103. Here, gate electrode 111 is favorably disposed so as to partially cover first field plate electrode 108.

In addition, second field plate electrode 112 is disposed on first field plate electrode 108 with second protective film 109 interposed between them. Here, it is desirable that a thickness of second field plate electrode 112 is larger than a thickness of gate electrode 111.

In addition, third protective film 113 is disposed so as to cover gate electrode 111 and second field plate electrode 112, and wiring portions 115 are disposed so as to be electrically connected to source electrode 105 and drain electrode 106, respectively through openings formed in third protective film 113.

Furthermore, fourth protective film 116 is disposed so as to cover wiring portions 115. In addition, external terminals such as a pad electrode and a bump (not illustrated) are to be disposed so as to fill openings 117 formed in fourth protective film 116.

According to the above configuration, an electric field applied in gate electrode 111 can be effectively relaxed by first field plate electrode 108. In addition, parasitic capacity Cgd between gate electrode 111 and drain electrode 106 can be effectively reduced by second field plate electrode 112. As a result, a gain can be increased by reducing a current collapse, reducing the parasitic capacity between the gate and the drain, and reducing gate parasitic resistance Rg.

In addition, it is favorable that second field plate electrode 112 is not disposed on gate electrode 111 (in other words, it is favorable that second field plate electrode 112 is disposed so as not to cover a part of gate electrode 111). As shown in FIGS. 1A and 1B, in plan view, the second field plate electrode 112 overlaps the first field plate electrode 108 and does not overlap the gate electrode 111. In this case, even when a thickness of gate electrode 111 is increased, the field plate electrode can be prevented from being physically disconnected.

Furthermore, when the thickness of the second field plate electrode 112 is larger than the thickness of gate electrode 111, Cgd between gate electrode 111 and drain electrode 106 can be effectively and surely reduced.

In addition, it is favorable that a surface position of second field plate electrode 112 is at least higher than a surface position of gate electrode 111. In this case, Cgd between gate electrode 111 and drain electrode 106 can be effectively and surely reduced.

Furthermore, it is favorable that first field plate electrode 108 and second field plate electrode 112 are electrically connected to the source electrode.

Meanwhile, FIG. 1B is a view illustrating planar arrangements of gate electrode 111, source electrode 105, first field plate electrode 108, second field plate electrode 112, and drain electrode 106 in FIG. 1A.

As illustrated in FIG. 1B, first field plate electrode 108 is connected to second field plate electrode 112 through via hole 119 in an outside region of element region 118.

In addition, a plurality of via holes may be disposed in the outside region to connect first field plate electrode 108 to second field plate electrode 112 through these via holes.

Here, FIG. 1B illustrates a structure in which first field plate electrode 108 is connected to second field plate electrode 112 through via hole 119 disposed in the outside region of element region 118 on right side in the drawing. However, instead of the structure illustrated in FIG. 1B, as another structure, first field plate electrode 108 may be connected to second field plate electrode 112 through a via hole disposed in the outside region of element region 118 on the left side of the drawing, or both structure may be combined (they may be connected on right and left sides in the drawing).

Furthermore, as a conceivable structure, an opening is formed in first protective film 107 on second field plate electrode 112, and source electrode 105 and second field plate electrode 112 are connected through the opening.

Here, the element region means a region provided on an inner side of a region surrounded by any of gate electrode 111, source electrode 105, and drain electrode 106.

(Description of Manufacturing Method)

FIGS. 2A to 2L are each cross-sectional views of manufacturing steps of the semiconductor device according to the first exemplary embodiment.

Figure 2A:
FIG. 2A is a view illustrating a method for manufacturing the semiconductor device according to the first exemplary embodiment.

First, as illustrated in FIG. 2A, substrate 101 made of silicon (Si), gallium nitride (GaN), sapphire, or SiC, for example is prepared. After that, first semiconductor layer 102 having a thickness of about 2 μm and made of the Group III nitride semiconductor, and second semiconductor layer 102 having a thickness of about 25 nm and made of the Group III nitride semiconductor are sequentially grown on substrate 101 by a metalorganic chemical vapor deposition (MOCVD) method.

Figure 2B:
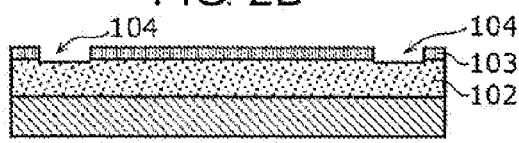
FIG. 2B is a view illustrating the method for manufacturing the semiconductor device according to the first exemplary embodiment.

Subsequently, as illustrated in FIG. 2B, after a resist has been patterned, recessed portion 104 is formed in second semiconductor layer 103 by dry etching. Here, it is favorable that recessed portion 104 is etched to a depth below the two-dimensional electron gas layer so that a bottom surface of recessed portion 104 is positioned below the interface between first semiconductor layer 102 and second semiconductor layer 103.

Figure 2C:
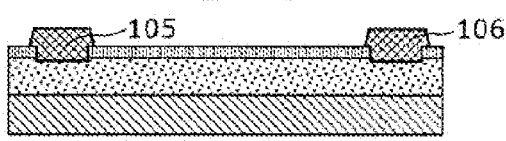
FIG. 2C is a view illustrating the method for manufacturing the semiconductor device according to the first exemplary embodiment.

Subsequently, as illustrated in FIG. 2C, source electrode 105 and drain electrode 106 each made of Ti/Al (about 20 nm/about 200 nm), for example are sequentially formed on recessed portion 104.

Figure 2D:
FIG. 2D is a view illustrating the method for manufacturing the semiconductor device according to the first exemplary embodiment.

Subsequently, as illustrated in FIG. 2D, first protective film 107 having a thickness of about 50 nm and made of silicon nitride (SiN), $SiO_2$, $Al_2O_3$, or AlN, for example is formed over a whole surface of substrate 101.

Figure 2E:
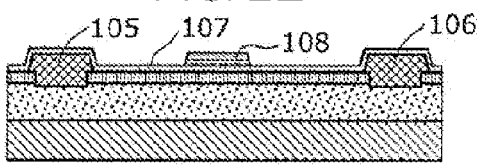
FIG. 2E is a view illustrating the method for manufacturing the semiconductor device according to the first exemplary embodiment.

Subsequently, as illustrated in FIG. 2E, first field plate electrode 108 made of Ti/Al (thickness about 20 nm/about 400 nm), for example is formed on first protective film 107 provided between source electrode 105 and drain electrode 106.

Figure 2F:
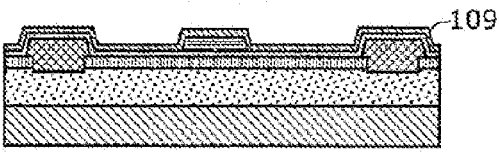
FIG. 2F is a view illustrating the method for manufacturing the semiconductor device according to the first exemplary embodiment.

Subsequently, as illustrated in FIG. 2F, second protective film 109 having a thickness of about 100 nm and made of silicon nitride (SiN), $SiO_2$, $Al_2O_3$, or AlN, for example is formed over the whole surface of substrate 101.

Figure 2G:
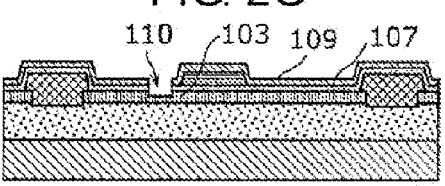
FIG. 2G is a view illustrating the method for manufacturing the semiconductor device according to the first exemplary embodiment.

Subsequently, as illustrated in FIG. 2G, after a resist has been patterned, opening 110 is formed in first protective film 107, second protective film 109, and second semiconductor layer 103 by dry etching. Second semiconductor layer 103 is exposed on a bottom part of opening 110.

Figure 2H:
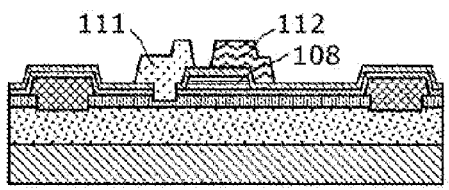
FIG. 2H is a view illustrating the method for manufacturing the semiconductor device according to the first exemplary embodiment.

Subsequently, as illustrated in FIG. 2H, gate electrode 111 made of Ni/Au (thickness about 200 nm/about 1.5 μm), for example is formed so as to fill opening 110. At the same time as the formation of gate electrode 111, second field plate electrode 112 made of Ni/Au (thickness about 200 nm/about 1.5 μm), for example is formed above first field plate electrode 108. Here, it is favorable that gate electrode 111 is thinner than second field plate electrode 112.

Figure 2I:
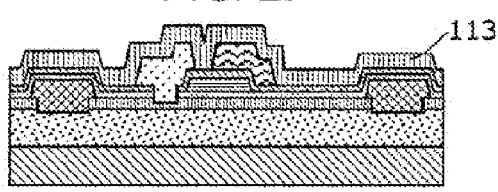
FIG. 2I is a view illustrating the method for manufacturing the semiconductor device according to the first exemplary embodiment.

Subsequently, as illustrated in FIG. 2I, third protective film 113 having a thickness of about 650 nm and made of silicon nitride (SiN), $SiO_2$, $Al_2O_3$, or AlN, for example is formed over the whole surface of substrate 101.

Figure 2J:
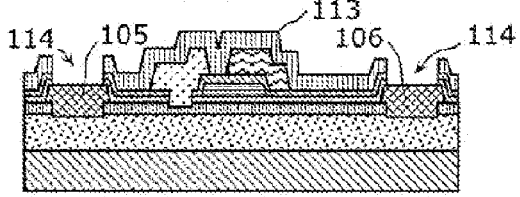
FIG. 2J is a view illustrating the method for manufacturing the semiconductor device according to the first exemplary embodiment.

Subsequently, as illustrated in FIG. 2J, openings 114 are formed in third protective film 113 so as to partially expose source electrode 105 and drain electrode 106 respectively.

Figure 2K:
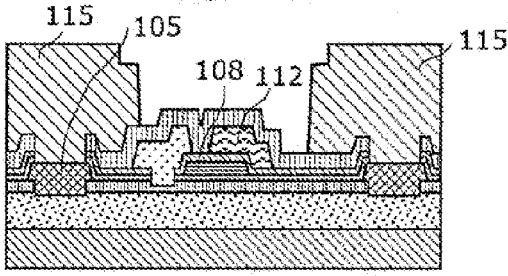
FIG. 2K is a view illustrating the method for manufacturing the semiconductor device according to the first exemplary embodiment.

Subsequently, as illustrated in FIG. 2K, wiring portion 115 having a thickness of about 5 μm and made of Au is formed so as to fill opening 114 by a plating method, for example. At this time, it is favorable that first field plate electrode 108 and second field plate electrode 112 are electrically connected to source electrode 105. In addition, wiring portion 115 may protrude to a space provided between the source and the drain.

Figure 2L:
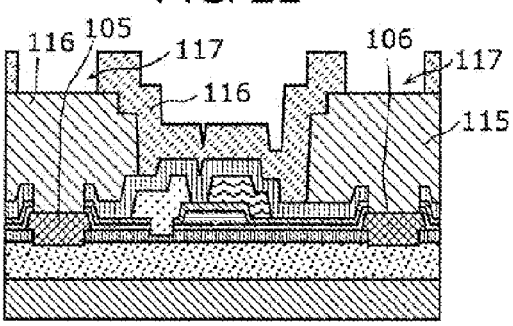
FIG. 2L is a view illustrating the method for manufacturing the semiconductor device according to the first exemplary embodiment.

Subsequently, as illustrated in FIG. 2L, fourth protective film 116 having a thickness of about 400 nm and made of silicon nitride (SiN), $SiO_2$, $Al_2O_3$, or AlN, for example is formed, and after a resist has been patterned, opening 117 is formed in fourth protective film 116 by dry etching. Openings 117 are formed to partially expose wiring portions 115 which are electrically connected to source electrode 105 and drain electrode 106, respectively. After that, external terminals such as the pad electrode and the bump (not illustrated) are sequentially disposed so as to fill openings 117.

Second Exemplary Embodiment

Hereinafter, a description will be given to a structure and a manufacturing method of a semiconductor device according to the second exemplary embodiment of the present invention.

(Description of Structure)

Figure 3A:
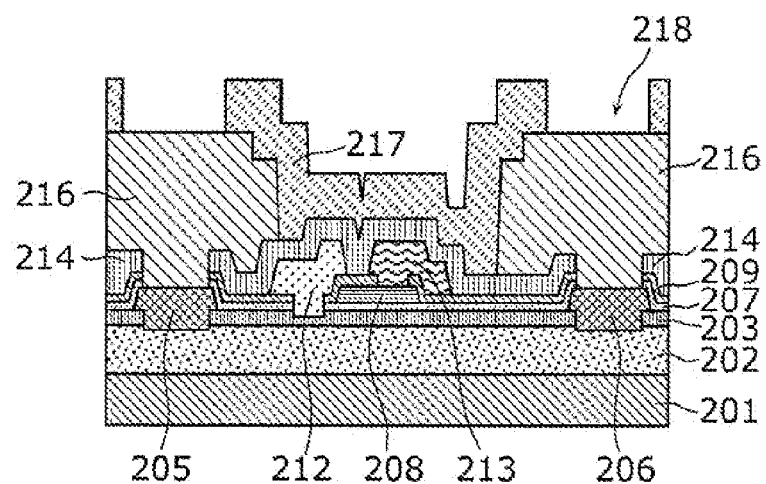
FIG. 3A is a cross-sectional view of a semiconductor device according to a second exemplary embodiment.
Figure 3B:
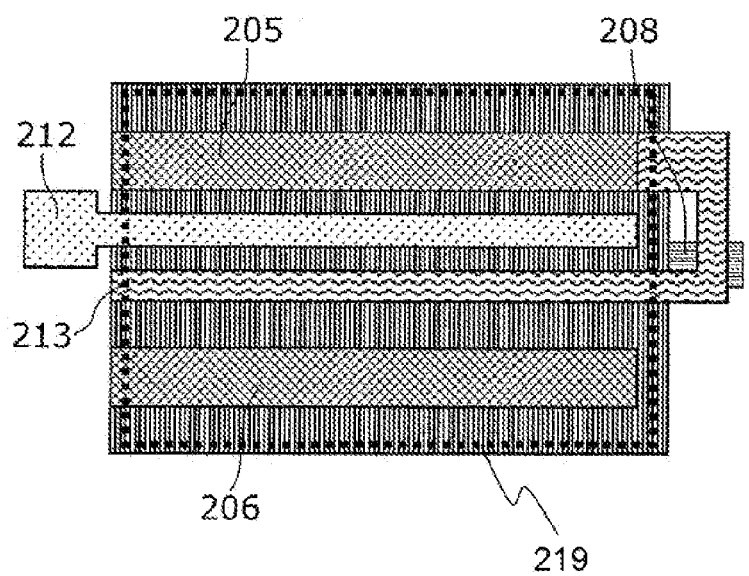
FIG. 3B is a top view of the semiconductor device according to the second exemplary embodiment.

FIGS. 3A and 3B are a cross-sectional view and a top view of the semiconductor device according to the second exemplary embodiment, respectively.

As for a main different point between this exemplary embodiment illustrated in FIG. 3A and the first exemplary embodiment illustrated in FIG. 1A, according to this exemplary embodiment, first field plate electrode 208 is directly connected to second field plate electrode 213 through an opening formed in second protective film 209.

In addition, configurations of substrate 201, first semiconductor layer 202, second semiconductor layer 203, source electrode 205, drain electrode 206, first protective film 207, first field plate electrode 208, second protective film 209, gate electrode 212, second field plate electrode 213, third protective film 214, wiring portion 216, fourth protective film 217, and opening 218 in the semiconductor device in this exemplary embodiment are similar to the configurations of substrate 101, first semiconductor layer 102, second semiconductor layer 103, source electrode 105, drain electrode 106, first protective film 107, first field plate electrode 108, second protective film 109, gate electrode 111, second field plate electrode 112, third protective film 113, wiring portion 115, fourth protective film 116, and opening 117 in the semiconductor device in the first exemplary embodiment, so that their descriptions are omitted.

As described above, according to this exemplary embodiment, first field plate electrode 208 is directly connected to second field plate electrode 213. As a result, compared with the first exemplary embodiment, necessity of drawing around a wiring can be eliminated. Furthermore, a contact part is large between first protective film 208 and second field plate electrode 213, and an electric field applied to them can be uniform, so that the electric field can be further effectively relaxed at a gate electrode end. In addition, other effects are similar to those of the first exemplary embodiment, so that their descriptions are omitted.

Meanwhile, FIG. 3B is a view illustrating planar arrangements of gate electrode 212, source electrode 205, first field plate electrode 208, second field plate electrode 213, and drain electrode 206 in FIG. 3A.

As illustrated in FIG. 3B, first field plate electrode 208 is connected to second field plate electrode 213 through the opening formed in second protective film 209 in element region 219. In addition, first field plate electrode 208 may be connected to second field plate electrode 213 through a via hole in an outside region of element region 219.

(Description of Manufacturing Method)

FIGS. 4A to 4M are each cross-sectional views of manufacturing steps of the semiconductor device according to the second exemplary embodiment.

First, the manufacturing method illustrated in FIGS. 4A to 4F is similar to the manufacturing method illustrated in FIGS. 2A to 2D. That is, first semiconductor layer 202, second semiconductor layer 203, recessed portion 204, source electrode 205, drain electrode 206, first protective film 207, first field plate electrode 208, and second protective film 209 are sequentially formed on substrate 201.

Figure 4A:
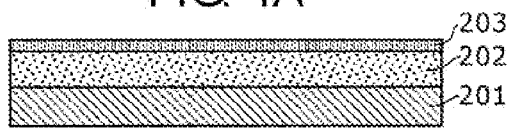
FIG. 4A is a view illustrating a method for manufacturing the semiconductor device according to the second exemplary embodiment.
Figure 4B:
FIG. 4B is a view illustrating the method for manufacturing the semiconductor device according to the second exemplary embodiment.
Figure 4C:
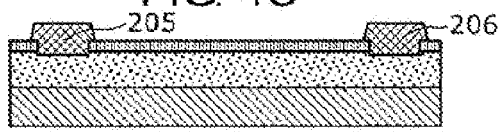
FIG. 4C is a view illustrating the method for manufacturing the semiconductor device according to the second exemplary embodiment.
Figure 4D:
FIG. 4D is a view illustrating the method for manufacturing the semiconductor device according to the second exemplary embodiment.
Figure 4E:
FIG. 4E is a view illustrating the method for manufacturing the semiconductor device according to the second exemplary embodiment.
Figure 4F:
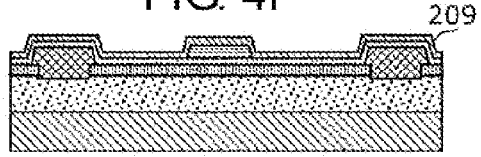
FIG. 4F is a view illustrating the method for manufacturing the semiconductor device according to the second exemplary embodiment.
Figure 4G:
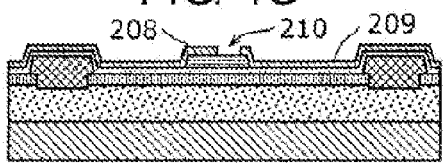
FIG. 4G is a view illustrating the method for manufacturing the semiconductor device according to the second exemplary embodiment.
Figure 4H:
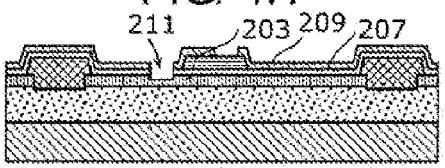
FIG. 4H is a view illustrating the method for manufacturing the semiconductor device according to the second exemplary embodiment.

Subsequently, as illustrated in FIG. 4G, after a resist has been patterned, opening 210 is formed in second protective film 209 on first field plate electrode 208 by dry etching. First field plate electrode 208 is partially exposed on a bottom part of opening 210.

Subsequently, as illustrated in FIGS. 4H to 4M, opening 211, gate electrode 212, second field plate electrode 213, third protective film 214, opening 215, wiring portion 216, fourth protective film 217, and opening 218 are sequentially formed by procedures similar to those illustrated in FIGS. 2G to 2L.

Figure 4I:
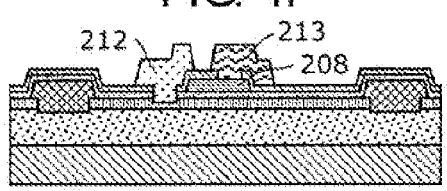
FIG. 4I is a view illustrating the method for manufacturing the semiconductor device according to the second exemplary embodiment.
Figure 4J:
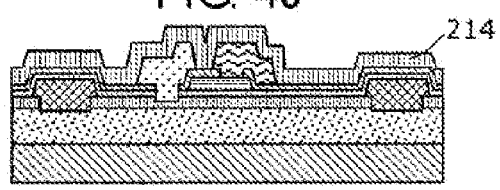
FIG. 4J is a view illustrating the method for manufacturing the semiconductor device according to the second exemplary embodiment.
Figure 4K:
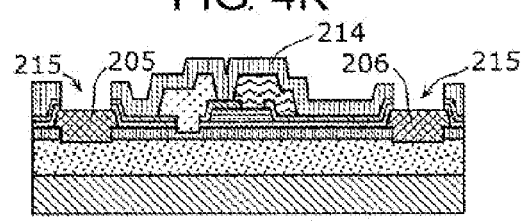
FIG. 4K is a view illustrating the method for manufacturing the semiconductor device according to the second exemplary embodiment.
Figure 4L:
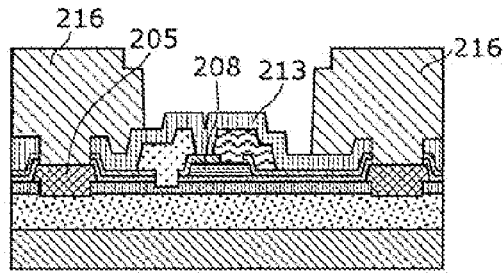
FIG. 4L is a view illustrating the method for manufacturing the semiconductor device according to the second exemplary embodiment.
Figure 4M:
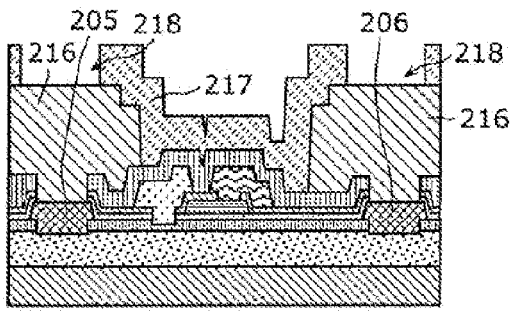
FIG. 4M is a view illustrating the method for manufacturing the semiconductor device according to the second exemplary embodiment.

According to this exemplary embodiment, as illustrated in FIG. 4I, first field plate electrode 208 is directly connected to second field plate electrode 213 through opening 210, which is a main different point from the first exemplary embodiment. In addition, similar to the first exemplary embodiment, first field plate electrode 208 and second field plate electrode 213 are electrically connected to source electrode 205.

Third Exemplary Embodiment

Hereinafter, a description will be given to a structure and a manufacturing method of a semiconductor device according to the third exemplary embodiment of the present invention.

(Description of Structure)

Figure 5A:
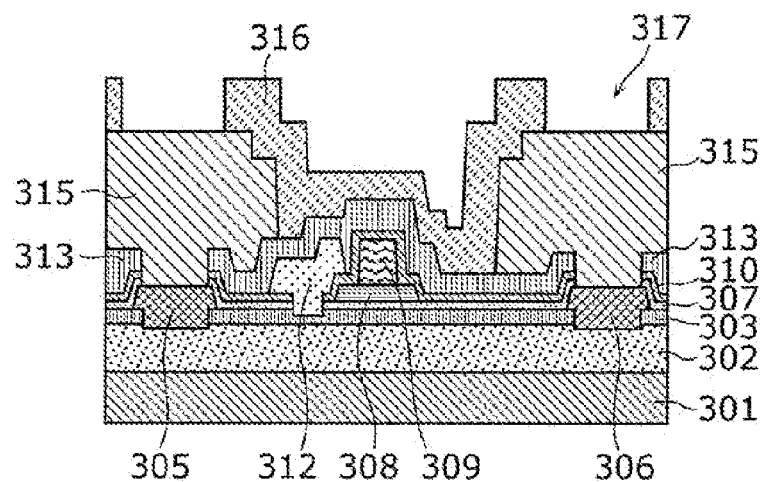
FIG. 5A is a cross-sectional view of a semiconductor device according to a third exemplary embodiment.
Figure 5B:
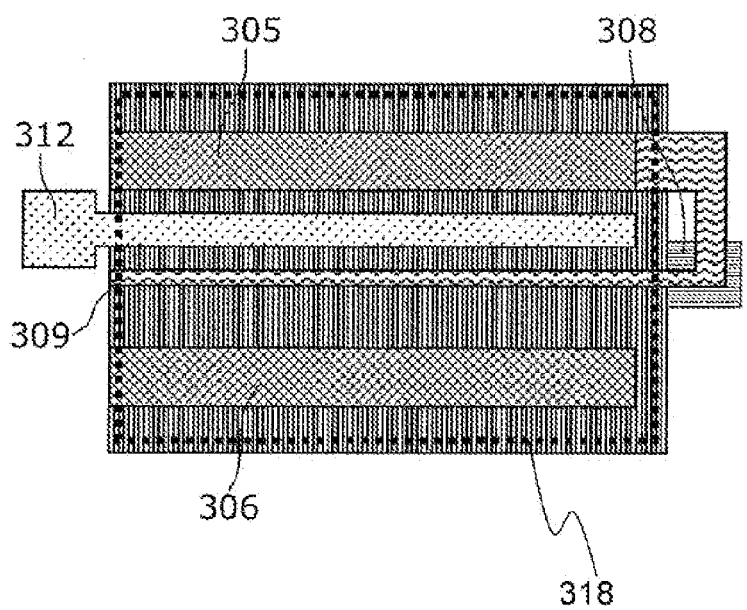
FIG. 5B is a top view of the semiconductor device according to the third exemplary embodiment.

FIGS. 5A and 5B are a cross-sectional view and a top view of the semiconductor device according to the third exemplary embodiment, respectively.

As for a main different point between this exemplary embodiment illustrated in FIG. 5A and the first exemplary embodiment illustrated in FIG. 1A, according to this exemplary embodiment, first field plate electrode 308 is directly connected to second field plate electrode 309. Especially, according to this exemplary embodiment, a whole lower surface of second field plate electrode 309 is directly connected to an upper surface of first field plate electrode 308.

In addition, configurations of substrate 301, first semiconductor layer 302, second semiconductor layer 303, source electrode 305, drain electrode 306, first protective film 307, first field plate electrode 308, second field plate electrode 309, second protective film 310, gate electrode 312, third protective film 313, wiring portion 315, fourth protective film 316, and opening 317 in the semiconductor device in this exemplary embodiment are similar to the configurations of substrate 101, first semiconductor layer 102, second semiconductor layer 103, source electrode 105, drain electrode 106, first protective film 107, first field plate electrode 108, second field plate electrode 112, second protective film 109, gate electrode 111, third protective film 113, wiring portion 115, fourth protective film 116, and opening 117 in the semiconductor device in the first exemplary embodiment, so that their descriptions are omitted.

As described above, according to this exemplary embodiment, the first field plate electrode 308 is directly connected to second field plate electrode 309. As a result, compared with the first exemplary embodiment, necessity of drawing around a wiring can be eliminated. Furthermore, a contact part is large between first field plate electrode 308 and second field plate electrode 309, so that an electric field applied to a gate electrode end can be more uniform. In addition, other effects are similar to those of the first exemplary embodiment, so that their descriptions are omitted.

Meanwhile, FIG. 5B is a view illustrating planar arrangements of gate electrode 312, source electrode 305, first field plate electrode 308, second field plate electrode 309, and drain electrode 306 in FIG. 5A.

As illustrated in FIG. 5B, an area of first field plate electrode 308 is larger than an area of second field plate electrode 309 in a planarly viewed arrangement. Furthermore, the whole lower surface of second field plate electrode 309 is in contact with first field plate electrode 308 in an element region. In addition, first field plate electrode 308 may be connected to second field plate electrode 309 through a via hole in an outside region of element region 318.

(Description of Manufacturing Method)

FIGS. 6A to 6M are each cross-sectional views of manufacturing steps of the semiconductor device according to the third exemplary embodiment, respectively.

First, the manufacturing method illustrated in FIG. 6A to 6E is similar to the manufacturing method illustrated in FIG. 2A to 2E. That is, first semiconductor layer 302, second semiconductor layer 303, recessed portion 304, source electrode 305, drain electrode 306, first protective film 307, and first field plate electrode 308 are sequentially formed on substrate 301.

Figure 6A:
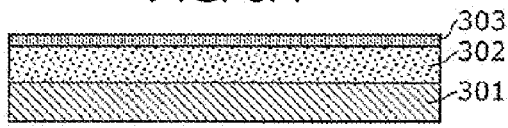
FIG. 6A is a view illustrating a method for manufacturing the semiconductor device according to the third exemplary embodiment.
Figure 6B:
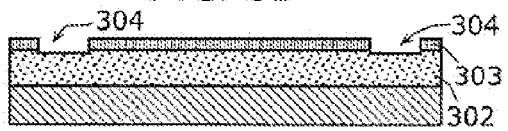
FIG. 6B is a view illustrating the method for manufacturing the semiconductor device according to the third exemplary embodiment.
Figure 6C:
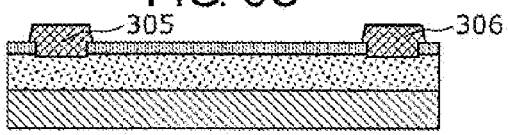
FIG. 6C is a view illustrating the method for manufacturing the semiconductor device according to the third exemplary embodiment.
Figure 6D:
FIG. 6D is a view illustrating the method for manufacturing the semiconductor device according to the third exemplary embodiment.
Figure 6E:
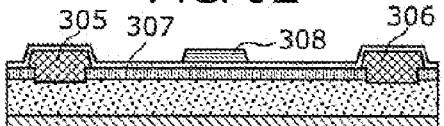
FIG. 6E is a view illustrating the method for manufacturing the semiconductor device according to the third exemplary embodiment.
Figure 6F:
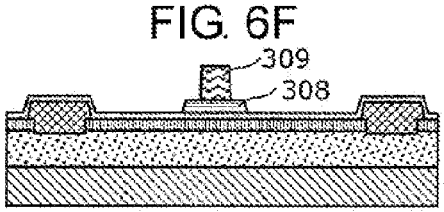
FIG. 6F is a view illustrating the method for manufacturing the semiconductor device according to the third exemplary embodiment.
Figure 6G:
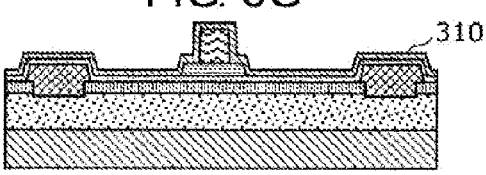
FIG. 6G is a view illustrating the method for manufacturing the semiconductor device according to the third exemplary embodiment.
Figure 6H:
FIG. 6H is a view illustrating the method for manufacturing the semiconductor device according to the third exemplary embodiment.
Figure 6I:
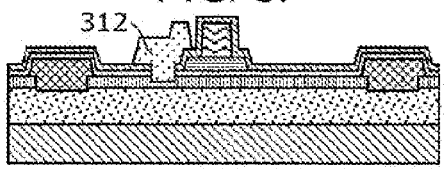
FIG. 6I is a view illustrating the method for manufacturing the semiconductor device according to the third exemplary embodiment.
Figure 6J:
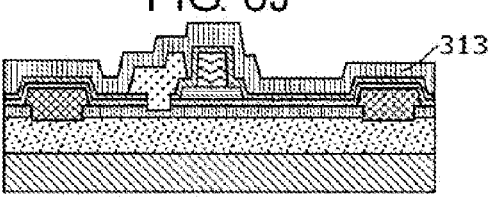
FIG. 6J is a view illustrating the method for manufacturing the semiconductor device according to the third exemplary embodiment.
Figure 6K:
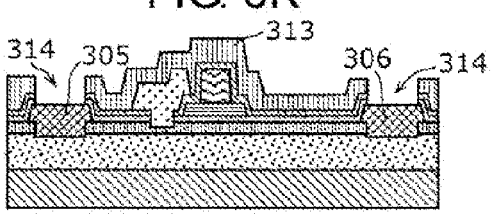
FIG. 6K is a view illustrating the method for manufacturing the semiconductor device according to the third exemplary embodiment.
Figure 6L:
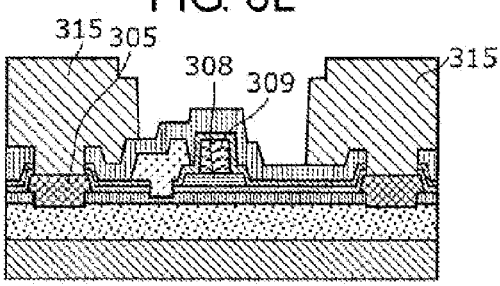
FIG. 6L is a view illustrating the method for manufacturing the semiconductor device according to the third exemplary embodiment.
Figure 6M:
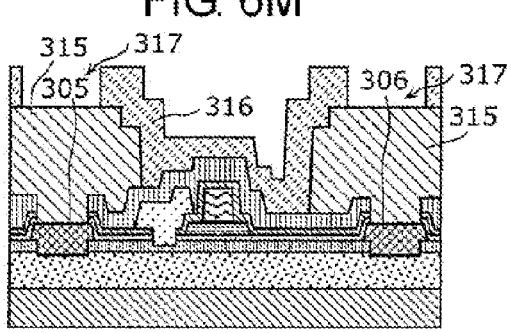
FIG. 6M is a view illustrating the method for manufacturing the semiconductor device according to the third exemplary embodiment.

Subsequently, as illustrated in FIG. 6F, second field plate electrode 309 made of Ti/Al (thickness about 20 nm/about 400 nm), for example is formed on first field plate electrode 308. In addition, it is favorable that a width of second field plate electrode 309 is smaller than a width of first field plate electrode 308. Here, a laminated structure of first field plate electrode 308 and second field plate electrode 309 includes a Ti layer, an Al layer, a Ti layer, and an Al layer which are sequentially formed from the bottom. Therefore, the Ti layer is interposed in an interface between first field plate electrode 308 and second field plate electrode 309 (between the Al layer and the Al layer).

Subsequently, as illustrated in FIGS. 6G to 6M, second protective film 310, opening 311, gate electrode 312, third protective film 313, opening 314, wiring portion 315, fourth protective film 316, and opening 317 are sequentially formed by procedures similar to those illustrated in FIGS. 2F to 2L.

According to this exemplary embodiment, as illustrated in FIG. 6F, first field plate electrode 308 is directly connected to second field plate electrode 309, which is a main different point from the first exemplary embodiment. In addition, similar to the first exemplary embodiment, first field plate electrode 308 and second field plate electrode 309 are electrically connected to source electrode 305.

Fourth Exemplary Embodiment

Hereinafter, a description will be given to a structure and a manufacturing method of a semiconductor device according to the fourth exemplary embodiment of the present invention.

(Description of Structure)

Figure 7A:
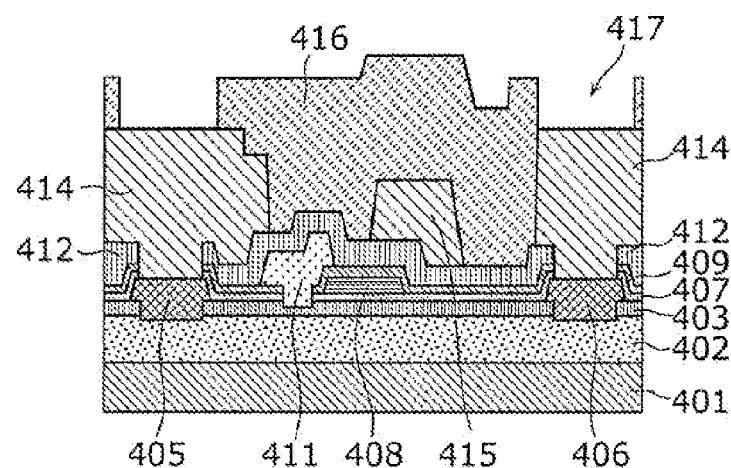
FIG. 7A is a cross-sectional view of a semiconductor device according to a fourth exemplary embodiment.
Figure 7B:
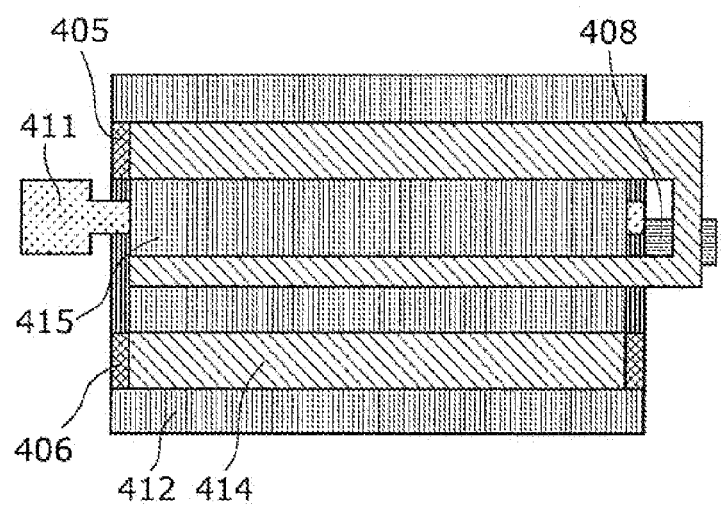
FIG. 7B is a top view of the semiconductor device according to the fourth exemplary embodiment.

FIGS. 7A and 7B are a cross-sectional view and a top view of the semiconductor device according to the fourth exemplary embodiment, respectively.

As for a main different point between this exemplary embodiment illustrated in FIG. 7A and the first exemplary embodiment illustrated in FIG. 1A, compared with the first exemplary embodiment, two field plate electrodes are distant from each other. According to this exemplary embodiment, first field plate electrode 408 and wiring portion 415 functioning as the second field plate electrode are formed with second protective film 409 and third protective film 412 interposed between them. Here, it is favorable that second protective film 409 is partially disposed under gate electrode 411, and a thickness of second protective film 409 is smaller than a thickness of third protective film 412.

In addition, configurations of substrate 401, first semiconductor layer 402, second semiconductor layer 403, source electrode 405, drain electrode 406, first protective film 407, first field plate electrode 408, second protective film 409, gate electrode 411, third protective film 412, wiring portions 414 and 415, fourth protective film 416, and opening 417 in the semiconductor device in this exemplary embodiment are similar to the configurations of substrate 101, first semiconductor layer 102, second semiconductor layer 103, source electrode 105, drain electrode 106, first protective film 107, first field plate electrode 108, second protective film 109, gate electrode 111, third protective film 113, wiring portion 115, fourth protective film 116, and opening 117 in the semiconductor device in the first exemplary embodiment, so that their descriptions are omitted.

Effects of the semiconductor device in this exemplary embodiment configured as descried above, are similar to those of the first exemplary embodiment, so that their descriptions are omitted.

Meanwhile, FIG. 7B is a view illustrating planar arrangements of gate electrode 411, source electrode 405, first field plate electrode 408, second field plate electrode (wiring portion) 415, wiring portion 414, third protective film 412, and drain electrode 306 in FIG. 7A. Connection relations among the electrodes are similar to those in the configuration in the first exemplary embodiment.

(Description of Manufacturing Method)

FIGS. 8A to 8L are each cross-sectional views of manufacturing steps of the semiconductor device according to the fourth exemplary embodiment.

First, the manufacturing method illustrated in FIGS. 8A to 8G is similar to the manufacturing method illustrated in FIGS. 2A to 2G. That is, first semiconductor layer 402, second semiconductor layer 403, recessed portion 404, source electrode 405, drain electrode 406, first protective film 407, first field plate electrode 408, second protective film 409, and opening 410 are sequentially formed on substrate 401.

Figure 8A:
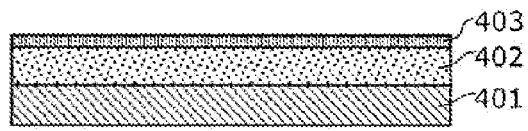
FIG. 8A is a view illustrating a method for manufacturing the semiconductor device according to the fourth exemplary embodiment.
Figure 8B:
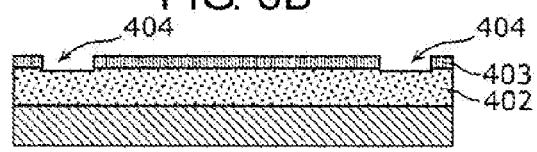
FIG. 8B is a view illustrating the method for manufacturing the semiconductor device according to the fourth exemplary embodiment.
Figure 8C:
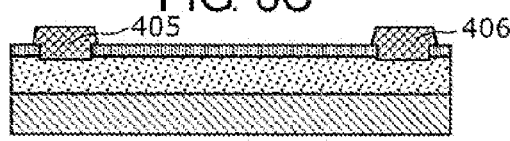
FIG. 8C is a view illustrating the method for manufacturing the semiconductor device according to the fourth exemplary embodiment.
Figure 8D:
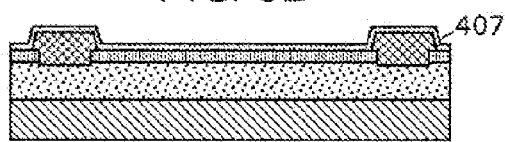
FIG. 8D is a view illustrating the method for manufacturing the semiconductor device according to the fourth exemplary embodiment.
Figure 8E:
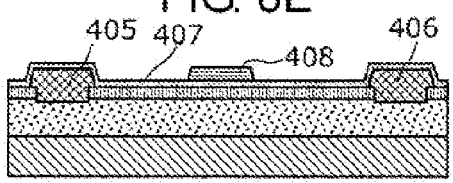
FIG. 8E is a view illustrating the method for manufacturing the semiconductor device according to the fourth exemplary embodiment.
Figure 8F:
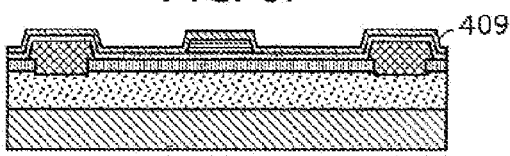
FIG. 8F is a view illustrating the method for manufacturing the semiconductor device according to the fourth exemplary embodiment.
Figure 8G:
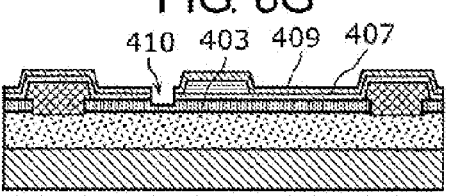
FIG. 8G is a view illustrating the method for manufacturing the semiconductor device according to the fourth exemplary embodiment.
Figure 8H:
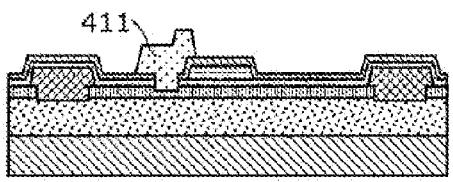
FIG. 8H is a view illustrating the method for manufacturing the semiconductor device according to the fourth exemplary embodiment.

Subsequently, as illustrated in FIG. 8H, gate electrode 411 made of Ni/Au (thickness about 200 nm/about 1.5 μm), for example is formed so as to fill opening 410.

Figure 8I:
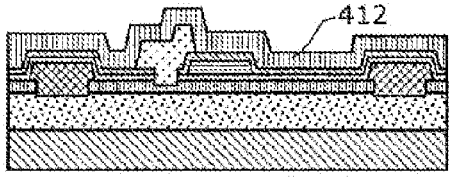
FIG. 8I is a view illustrating the method for manufacturing the semiconductor device according to the fourth exemplary embodiment.
Figure 8J:
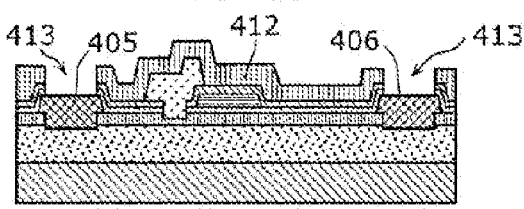
FIG. 8J is a view illustrating the method for manufacturing the semiconductor device according to the fourth exemplary embodiment.

Subsequently, as illustrated in FIGS. 8I to 8J, third protective film 412 and opening 413 are sequentially formed by procedures similar to those in FIGS. 2I to 2J.

Figure 8K:
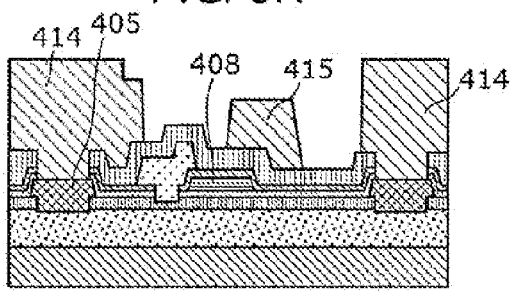
FIG. 8K is a view illustrating the method for manufacturing the semiconductor device according to the fourth exemplary embodiment.

Subsequently, as illustrated in FIG. 8K, wiring portion 414 having a thickness of about 5 μm and made of Au is formed so as to fill opening 413 by a plating method, for example, and wiring portion 415 is formed above first field plate electrode 408. Here, first field plate electrode 408 and wiring portion 415 are electrically connected to source electrode 405.

Figure 8L:
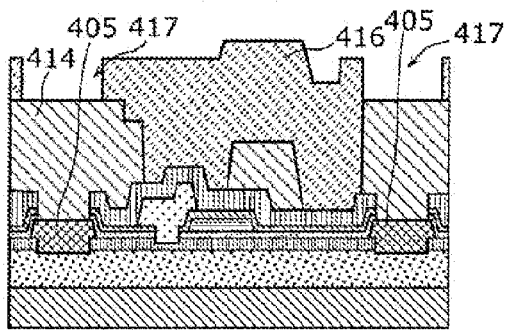
FIG. 8L is a view illustrating the method for manufacturing the semiconductor device according to the fourth exemplary embodiment.

Subsequently, as illustrated in FIG. 8L, fourth protective film 416 and opening 417 are formed by a procedure similar to that in FIG. 2L.

According to this exemplary embodiment, as illustrated in FIG. 8K, first field plate electrode 408 and wiring portion 415 functioning as the second field plate electrode are formed with second protective film 409 and third protective film 412 interposed between them, so that compared with the first exemplary embodiment, the two field plate electrodes are distant from each other. This point is the main different point from the first exemplary embodiment.

INDUSTRIAL APPLICABILITY

According to the present invention, useful effects concerning an increase in gain can be obtained by reducing a current collapse, reducing Cgd, and reducing Rg, so that the present invention is useful for a semiconductor device such as a field effect transistor having a high frequency, a high power, and a high withstand voltage.

REFERENCE MARKS IN THE DRAWINGS

101 Substrate
102 First semiconductor layer
103 Second semiconductor layer
104 Recessed part
105 Source electrode
106 Drain electrode
107 First protective film
108 First field plate electrode
109 Second protective film
110 Opening
111 Gate electrode
112 Second field plate electrode
113 Third protective film
114 Opening
115 Wiring portion
116 Fourth protective film
117 Opening
118 Element region
119 Via hole
201 Substrate
202 First semiconductor layer
203 Second semiconductor layer
204 Recessed part
205 Source electrode
206 Drain electrode
207 First protective film
208 First field plate electrode
209 Second protective film
210 Opening
211 Opening
212 Gate electrode
213 Second field plate electrode
214 Third protective film
215 Opening 216 Wiring portion
217 Fourth protective film
218 Opening
219 Element region
301 Substrate
302 First semiconductor layer
303 Second semiconductor layer
304 Recessed part
305 Source electrode
306 Drain electrode
307 First protective film
308 First field plate electrode
309 Second field plate electrode
310 Second protective film
311 Opening
312 Gate electrode
313 Third protective film
314 Opening
315 Wiring portion
316 Fourth protective film
317 Opening
318 Element region
401 Substrate
402 First semiconductor layer
403 Second semiconductor layer
404 Recessed part
405 Source electrode
406 Drain electrode
407 First protective film
408 First field plate electrode
409 Second protective film
410 Opening
411 Gate electrode
412 Third protective film
413 Opening
414 Wiring portion
415 Wiring portion (second field plate electrode)
416 Fourth protective film
417 Opening

The invention claimed is:

1. A semiconductor device comprising:
a substrate;
a first semiconductor layer disposed on the substrate and made of a Group III nitride semiconductor;
a second semiconductor layer disposed on the first semiconductor layer and made of a Group III nitride semiconductor;
a gate electrode, a source electrode, and a drain electrode disposed on the second semiconductor layer;
a first field plate electrode disposed on the second semiconductor layer; and
a second field plate electrode disposed on the first field plate electrode, wherein
the first field plate electrode and the second field plate electrode are disposed between the gate electrode and the drain electrode, and
in a view illustrating planar arrangement of the gate electrode, the source electrode, the first electrode, the second electrode and the drain electrode,
an element region includes the gate electrode, the source electrode, the first field plate electrode, the second field plate electrode and the drain electrode, and
the second field plate electrode is electrically connected to the source electrode through an outside region of the element region.

2. The semiconductor device according to claim 1, wherein the gate electrode is disposed so as to partially cover the first field plate electrode.

3. The semiconductor device according to claim 1, wherein the second field plate electrode has a thickness larger than a thickness of the gate electrode.

4. The semiconductor device according to claim 1, wherein the second field plate electrode has a surface position higher than a surface position of the gate electrode.

5. The semiconductor device according to claim 1, wherein the second field plate electrode is disposed so as not to cover a part of the gate electrode.

6. The semiconductor device according to claim 1, wherein the gate electrode is disposed so as to fill a recessed portion formed in an upper surface of the second semiconductor layer.

7. The semiconductor device according to claim 1, wherein a protective film is formed on the second semiconductor layer, and the gate electrode is formed on the protective film.

8. The semiconductor device according to claim 7, wherein
the protective film has a recessed portion to expose the second semiconductor layer, and
the gate electrode is disposed so as to fill the recessed portion.

9. The semiconductor device according to claim 1, wherein a protective film is interposed between the first field plate electrode and the second field plate electrode.

10. The semiconductor device according to claim 9, wherein the first field plate electrode is directly connected to the second field plate electrode through an opening formed in the protective film.

11. The semiconductor device according to claim 9, wherein the protective film comprises a first protective film and a second protective film, the first protective film is partially disposed under the gate electrode, and the first protective film has a thickness smaller than a thickness of the second protective film.

12. The semiconductor device according to claim 7, wherein the protective film is made of one of SiN, $SiO_2$, $Al_2O_3$, and AlN.

13. The semiconductor device according to claim 1, wherein the first field plate electrode and the second field plate electrode are electrically connected to the source electrode.

14. The semiconductor device according to claim 1, wherein the first semiconductor layer contains GaN, and the second semiconductor layer contains $Al_xGa_{1-x}N$ ($0 \leq x \leq 1$).

15. The semiconductor device according to claim 1, wherein the second semiconductor layer has a second recessed portion and a third recessed portion, and
the drain electrode is disposed so as to fill the second recessed portion and the source electrode is disposed so as to fill the third recessed portion.

16. The semiconductor device according to claim 1, wherein in the view illustrating planar arrangement of the gate electrode, the source electrode, the first electrode, the second electrode and the drain electrode, the second field plate electrode overlaps the first field plate electrode, and does not overlap the gate electrode.

17. The semiconductor device according to claim 1, wherein
in the view illustrating planar arrangement, the second field plate electrode includes a first portion extending in a first direction parallel to the source electrode and a second portion in the outside region extending in a
second direction orthogonal to the first direction, and
the second portion of the second field plate electrode is
disposed immediately above a part of the first field
plate electrode.

\* \* \* \* \*